(12) United States Patent
Kitahara

(10) Patent No.: US 7,111,927 B2
(45) Date of Patent: Sep. 26, 2006

(54) PIEZOELECTRIC VIBRATOR UNIT

(75) Inventor: Tsuyoshi Kitahara, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 381 days.

(21) Appl. No.: 09/878,325

(22) Filed: Jun. 12, 2001

(65) Prior Publication Data

US 2002/0017142 A1 Feb. 14, 2002

(30) Foreign Application Priority Data

Jun. 12, 2000 (JP) ............................... 2000-175117

(51) Int. Cl.
B41J 2/045 (2006.01)

(52) U.S. Cl. .............................. 347/68; 347/68; 347/69; 347/70; 347/71; 347/72

(58) Field of Classification Search ............. 347/68–72
See application file for complete search history.

(56) References Cited

U.S. PATENT DOCUMENTS 5,786,833 A  7/1998 Naka et al.

FOREIGN PATENT DOCUMENTS

| EP | 0 518 380 A2 | 12/1992 |
| EP | 0 901 172 A1 | 3/1999 |
| JP | 61-272984 | 12/1986 |
| JP | 62-262472 | 11/1987 |
| JP | 63-16685 | 1/1988 |
| JP | 3-197049 | 8/1991 |
| JP | 3-264360 | 11/1991 |
| JP | 04-368852 | 12/1992 |
| JP | 05-084907 | 4/1993 |
| JP | 5-110157 | 4/1993 |
| JP | 05-193129 | 8/1993 |
| JP | 5-198860 | 8/1993 |
| JP | 05-198860 | 8/1993 |
| JP | 05-198861 | 8/1993 |
| JP | 06-312505 | 11/1994 |
| JP | 07-178902 | 7/1995 |
| JP | 11-078006 | 3/1999 |
| JP | 11-115192 | 4/1999 |
| JP | 11-138812 | 5/1999 |
| JP | 11277745 | * 10/1999 |
| JP | 11-277745 | 10/1999 |

OTHER PUBLICATIONS

Communication from European Patent Office, Sep. 09, 2003.

* cited by examiner

Primary Examiner—Stephen D. Meier
Assistant Examiner—Ly T Tran
(74) Attorney, Agent, or Firm—Sughrue Mion, PLLC (57) ABSTRACT

A piezoelectric vibrator unit comprises: at least one piezoelectric vibrator including: common internal electrode layers and segment internal electrode layers arranged alternately; piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a surface of the piezoelectric vibrator is fixed. The piezoelectric vibrator is displaceable in a direction perpendicular to a lamination direction in which the internal electrode layers and piezoelectric layers are laminated. The magnitude of electric fields applied to the piezoelectric layers is non-uniform.

24 Claims, 7 Drawing Sheets

PIEZOELECTRIC VIBRATOR UNIT

BACKGROUND OF THE INVENTION

The present invention relates to a piezoelectric vibrator unit preferably used to eject ink droplets, and an ink-jet recording head that employs the piezoelectric vibrator unit. In particular, the present invention relates to a piezoelectric vibrator unit and an ink-jet recording head that can suppress bending during the operation of the piezoelectric vibrator.

An ink-jet recording head (hereinafter referred to as a recording head) used for an image recording apparatus, such as an ink-jet printer or plotter, comprises: a flow passage unit, which includes pressure chambers and a reservoir; and a piezoelectric vibrator unit, which is located at the rear of the flow passage unit and which includes a plurality of piezoelectric vibrators for changing the volumes of the associated pressure chambers.

The following procedures, for example, are employed to fabricate the piezoelectric vibrator unit. First, common internal electrodes and segment internal electrodes are alternately laminated with piezoelectric material interposed between the adjacent internal electrodes to thereby form a plate-like laminated member. A common external electrode and a segment external electrode are formed on a surface of the laminated member to be electrically connected to the common internal electrodes and the segment internal electrodes, respectively. Then, one side face of the base end portion of the laminated member having the external electrodes is secured to a fixing plate, and thereafter, the leading end portion of the laminated member is cut into a plurality of extremely narrow piezoelectric vibrators using the a wire saw or a dicing saw.

The piezoelectric vibrator of this type is affected by a constraining force exerted at a joint portion thereof because one side face of the base end portion of the laminated member is secured to the fixing plate. That is, when voltage is applied to the external electrode to cause the piezoelectric vibrator to contract, the piezoelectric material in the opposite side (i.e. the side opposite in the lamination direction from the side where the piezoelectric vibrator is fixed to the fixing plate) tends to contract slightly more than the piezoelectric material in the fixing plate side.

Figure 9:
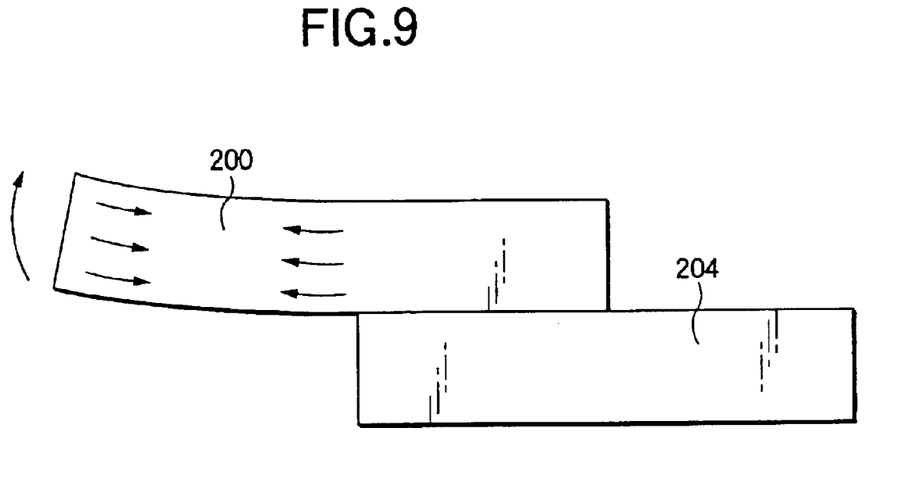
FIG. 9 is a specific diagram for explaining the bending of a related piezoelectric vibrator unit.

Therefore, as shown in FIG. 9, bending occurs, i.e., the piezoelectric vibrator 200 is bent in the lamination direction away from the fixing plate 204 (upward in FIG. 9).

Figure 10:
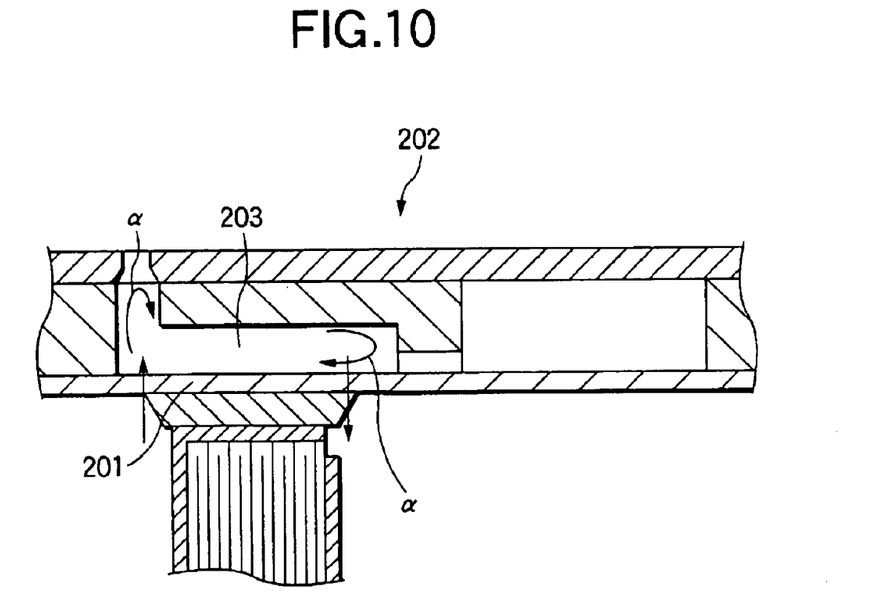
FIG. 10 is a diagram for explaining a reciprocating pressure wave in a pressure chamber.

Due to such bending of the piezoelectric vibrator 200, a pressure wave as denoted by α in FIG. 10 is generated within the pressure chamber 203 of a recording head 202, which repeatedly reflects and reciprocates within the pressure chamber 203 as if the pressure chamber 203 was an acoustic tube. The pressure wave adversely affects ink ejection by generating a mist or a satellite, or by curving the flight path of an ink droplet.

Since no damper element for positively attenuating the pressure wave is present in the pressure chamber 203, it takes a time until the pressure wave is satisfactorily attenuated. Consequently, a required time interval to a next ink droplet ejection is long, hindering the high frequency driving of the piezoelectric vibrator.

SUMMARY OF THE INVENTION

In view of the drawback, it is an object of the invention to provide a piezoelectric vibrator unit that can suppress the bending of a piezoelectric vibrator during the operation, to thereby more stably eject ink droplets. Another object of the present invention is to provide an ink-jet recording head that uses this piezoelectric vibrator unit.

To achieve the object, the present invention provides the following arrangements:

A piezoelectric vibrator unit comprises:

at least one piezoelectric vibrator including:

common internal electrode layers and segment internal electrode layers arranged alternately;

piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a surface of the piezoelectric vibrator is fixed;

wherein the piezoelectric vibrator is displaceable in a direction perpendicular to a lamination direction in which the internal electrode layers and piezoelectric layers are laminated;

wherein magnitude of electric fields applied to the piezoelectric layers is non-uniform.

Preferably, the electric fields applied to the piezoelectric layers have respective, different magnitude.

With this arrangement, it is possible to prevent the piezoelectric vibrator from vibrating in the unnecessary direction, and thus the directionability of the vibrating direction can be enhanced.

More preferably, magnitude of an electric field applied to a piezoelectric layer located farther from a thickness center of the piezoelectric vibrator in the lamination direction is smaller than magnitude of an electric field applied to a piezoelectric layer located closer to the thickness center in the lamination direction.

More preferably, as a piezoelectric layer is located farther from the surface fixed to the fixing member in the lamination direction, magnitude of electric field applied to the piezoelectric layer is smaller.

There is provided a piezoelectric vibrator unit comprising:

at least one piezoelectric vibrator including:

common internal electrode layers and segment internal electrode layers arranged alternately;

piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a surface of the piezoelectric vibrator is fixed;

wherein the piezoelectric vibrator is displaceable in a direction perpendicular to a lamination direction in which the internal electrode layers and piezoelectric layers are laminated;

wherein the piezoelectric layers are non-uniform in thickness.

With this arrangement also, it is possible to prevent the piezoelectric vibrator from vibrating in the unnecessary direction, and thus the directionability of the vibrating direction can be enhanced.

Preferably, at least one of the piezoelectric layers, located away from the surface fixed to said fixing member, is thicker than other piezoelectric layers.

More preferably, as a piezoelectric layer is located farther from the surface fixed to the fixing member in the lamination direction, the piezoelectric layer is thicker.

More preferably, an outermost piezoelectric layer, located farthest from the surface fixed to the fixing member, is thicker than other piezoelectric layers.

There is provided a piezoelectric vibrator unit comprising:

at least one piezoelectric vibrator including:

common internal electrode layers and segment internal electrode layers arranged alternately;

piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a first surface of the piezoelectric vibrator is fixed;

wherein the piezoelectric vibrator is displaceable in a direction perpendicular to a lamination direction in which the internal electrode layers and piezoelectric layers are laminated;

wherein parts of the external electrodes, located on a second surface opposite from the first surface, are thicker than other parts of the external electrodes.

With this arrangement also, it is possible to prevent the piezoelectric vibrator from vibrating in the unnecessary direction, and thus the directionability of the vibrating direction can be enhanced.

There is provided a piezoelectric vibrator unit comprising:

at least one piezoelectric vibrator including:

common internal electrode layers and segment internal electrode layers arranged alternately;

piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a first surface of the piezoelectric vibrator is fixed;

wherein the piezoelectric vibrator is displaceable in a direction perpendicular to a lamination direction in which the internal electrode layers and piezoelectric layers are laminated;

wherein the internal electrode layers are non-uniform in thickness.

With this arrangement also, it is possible to prevent the piezoelectric vibrator from vibrating in the unnecessary direction, and thus the directionability of the vibrating direction can be enhanced.

Preferably, at least one of the internal electrode layers, located away from a center line in the lamination direction, is thicker than other internal electrodes.

More preferably, as an internal electrode layer is located farther from the surface fixed to the fixing member in the lamination direction, the internal electrode layer is thicker.

There is provided a piezoelectric vibrator unit comprising:

at least one piezoelectric vibrator including:

common internal electrode layers and segment internal electrode layers arranged alternately;

piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a first surface of the piezoelectric vibrator is fixed;

wherein the piezoelectric vibrator is displaceable in a direction perpendicular to a lamination direction in which the internal electrode layers and piezoelectric layers are laminated;

wherein a length of at least one of the internal electrode layers, located away from the surface fixed to the fixing member, is shorter than other internal electrode layers.

With this arrangement also, it is possible to prevent the piezoelectric vibrator from vibrating in the unnecessary direction, and thus the directionability of the vibrating direction can be enhanced.

There is provided a piezoelectric vibrator unit comprising:

at least one piezoelectric vibrator including:

common internal electrode layers and segment internal electrode layers arranged alternately;

piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a first surface of the piezoelectric vibrator is fixed;

wherein the piezoelectric vibrator is displaceable in a direction perpendicular to a lamination direction in which the internal electrode layers and piezoelectric layers are laminated;

wherein the piezoelectric vibrator further comprises a bending moment adjustment member provided to a second surface of the piezoelectric vibrator, opposite in the lamination direction from the first surface fixed to the fixing member.

With this arrangement also, it is possible to prevent the piezoelectric vibrator from vibrating in the unnecessary direction, and thus the directionability of the vibrating direction can be enhanced.

There is provided a piezoelectric vibrator unit comprising:

at least one piezoelectric vibrator including:

common internal electrode layers and segment internal electrode layers arranged alternately;

piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a first surface of the piezoelectric vibrator is fixed;

wherein the piezoelectric vibrator is displaceable in a direction perpendicular to a lamination direction in which the internal electrode layers and piezoelectric layers are laminated;

wherein a second surface of the piezoelectric vibrator, opposite from the first surface and located in a free end part of the piezoelectric vibrator, is entirely covered with the external electrode, and the first surface, located in the free end part, is partially covered with the other external electrode.

With this arrangement also, it is possible to prevent the piezoelectric vibrator from vibrating in the unnecessary direction, and thus the directionability of the vibrating direction can be enhanced.

In these arrangements, the at least one piezoelectric vibrator includes comb-like piezoelectric vibrators constructing a piezoelectric vibrator group.

Further, the piezoelectric vibrator further includes a non-active portion that is not expanded or contracted even when the piezoelectric layers in an active region are driven, and the fixing member is joined to a side surface of the non-active portion.

The present invention also involves an ink-jet recording head comprising:

a piezoelectric vibrator unit constructed according to at least one of the above-noted arrangements; and a flow passage unit having an elastic plate serving as a part of a seal member for sealing a pressure chamber communicated with a nozzle openings, wherein said piezoelectric vibrator unit is attached by fixing a distal end face of the piezoelectric vibrator to the elastic plate.

The present disclosure relates to the subject matter contained in Japanese patent application No. 2000-175117 (filed on Jun. 12, 2000), which is expressly incorporated herein by reference in its entirety.

DESCRIPTION OF THE PREFERRED EMBODIMENT

The present invention will now be described with reference to illustrated embodiments. First, while referring to FIG. 8, an explanation will be given for an ink-jet printer (hereinafter simply referred to as a printer) that is a typical image recording apparatus.

Figure 8:
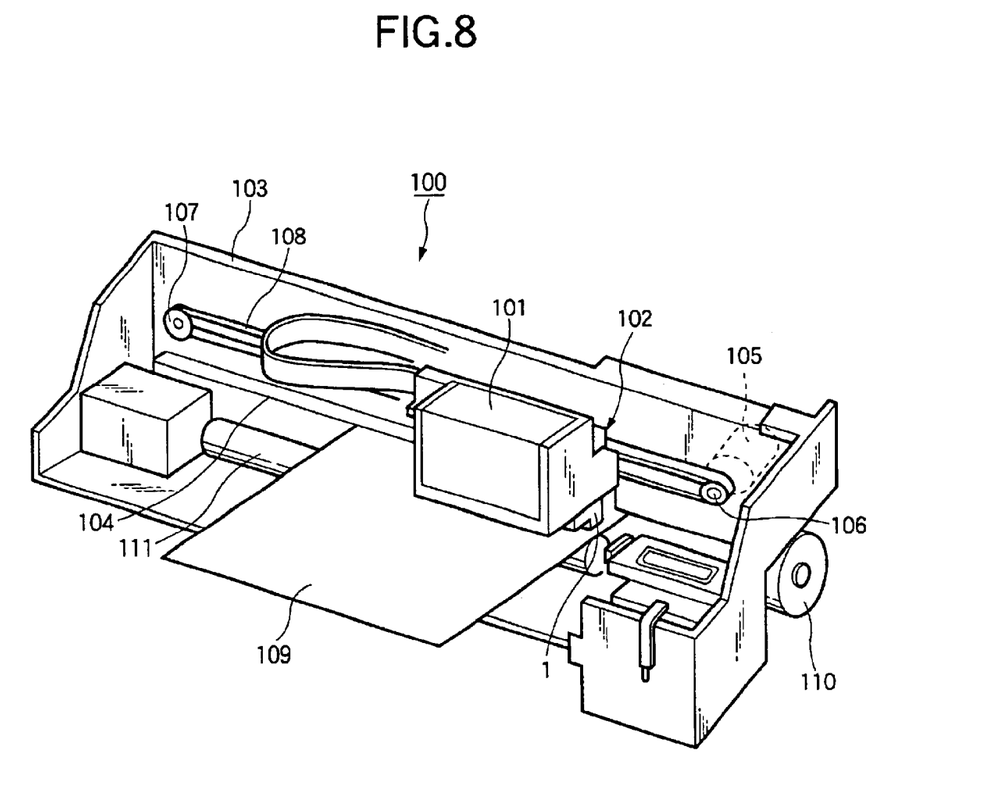
FIG. 8 is a perspective view for explaining the internal mechanism of an ink-jet printer.

A printer 100 includes a carriage 102 to which a recording head 1 is attached and in which an ink cartridge 101 is held. The carriage 102, which is movably fitted to a guide member 104 extended across a case 103, is reciprocatively moved along the guide member 104, i.e., in the main scanning direction, by a head scanning mechanism.

The head scanning mechanism includes: a pulse motor 105, provided at one lateral end of the case 103; a drive pulley 106, connected to the rotary shaft of the pulse motor 105; an idle pulley 107, provided at the other lateral end of the case 103; a timing belt 108, suspended between the drive pulley 106 and the idle pulley 107 and connected to the carriage 102; and a printer controller (not shown), for controlling the rotation of the pulse motor 105. That is, the head scanning mechanism drives the pulse motor 105 to reciprocatively move the carriage 102, i.e., the recording head 1, in the width direction of a recording sheet 109, which is one type of printing medium. The printer 100 also includes a paper feeding mechanism for feeding recording sheets 109 in the sub-scanning direction, perpendicular to the main scanning direction. The paper feeding mechanism includes a paper feed motor 110 and a paper feed roller 111. Based on print data received from a host computer, the printer controller controls the recording head 1, the pulse motor 105 and the paper feed roller 110, and sequentially feeds the recording sheets 109 while moving the recording head 1 in the main scanning direction.

Figure 1:
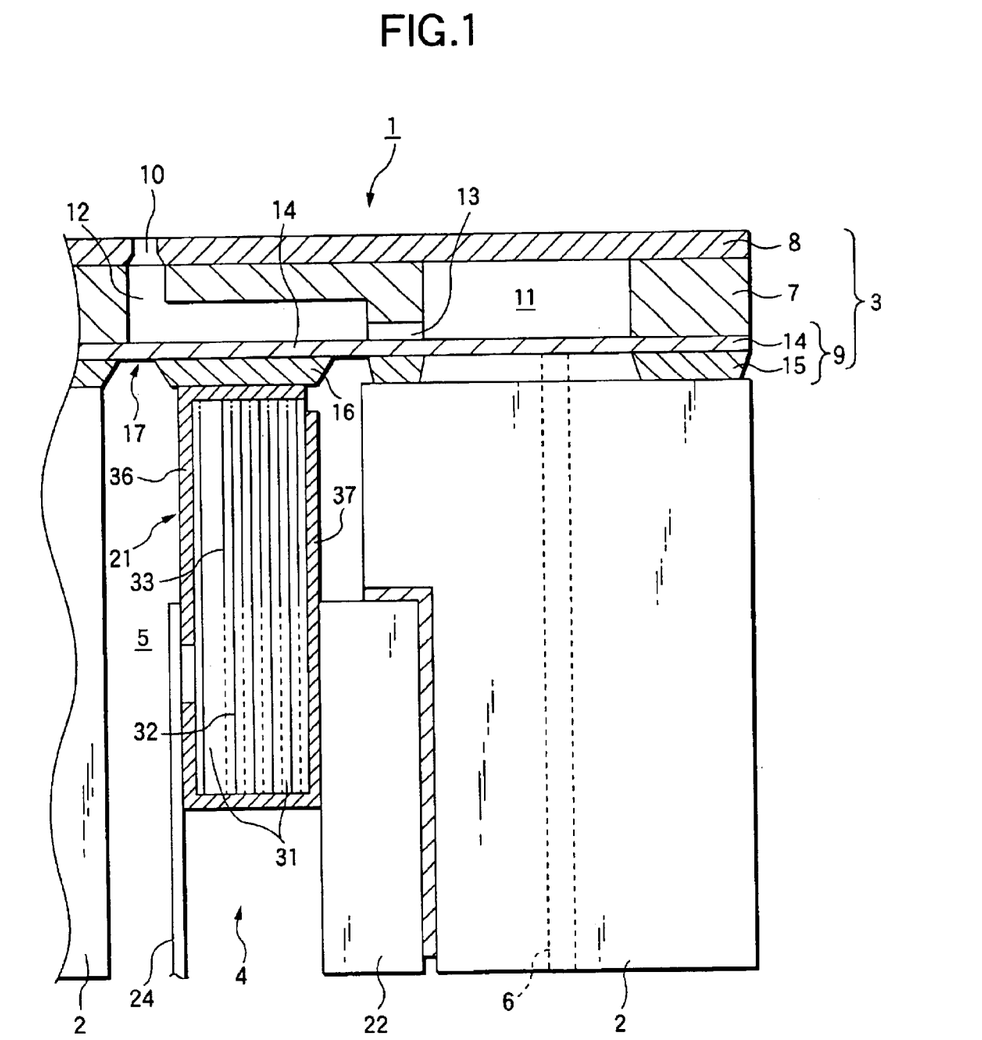
FIG. 1 is an enlarged cross-sectional view of a piezoelectric vibrator unit and an ink-jet recording head.

The recording head 1 will now be described in detail. FIG. 1 is an enlarged cross-sectional view of the essential portion of the ink-jet recording head 1.

The recording head 1 comprises a case 2, a flow passage unit 3 and a piezoelectric vibrator unit 4. For convenience during the explanation, the top in FIG. 1 is defined as the distal end (the front) and the bottom is defined as the base end (the rear).

The case 2 is a block-shaped, synthetic resin member, having a storage space 5 that is open at both ends. The flow passage unit 3 is joined to the leading end surface of the case 2, and the piezoelectric vibrator unit 4 is securely housed in the storage space 5 in a state in which the leading ends of the comb-shaped teeth of a vibrator group 21 face the leading end opening of the storage space 5. Ink supply tubes 6, which communicate with an ink cartridge at the base end, are provided along a lateral side of the storage space 5.

The flow passage unit 3 is mainly formed of a flow passage formation plate 7, a nozzle plate 8 and an elastic plate 9. The nozzle plate 8 is a thin, plate-like member formed of stainless steel, for example, in which a large number (for example, 48) of nozzle openings 10 are arrayed in rows at pitches corresponding to the dot formation density. The flow passage formation plate 7 stacked on the nozzle plate 8 includes reservoirs 11, into which ink flows that is supplied through the ink supply tubes 6; pressure chambers 12, for generating the ink pressure required to eject ink from the corresponding nozzle openings 10; and ink supply ports 13 connecting the reservoir 11 and the pressure chambers 12. In this embodiment, etching of a silicon wafer is employed to produce these components of the plate 7.

In this embodiment, the elastic plate 9 has a double structure in which a polymer film, such as PPS (polyphenylene sulfide), which serves as an elastic film 14, is laminated on a stainless plate 15. Unnecessary portions of the stainless plate 15 that correspond to the reservoirs 11 and the like are removed by etching to obtain island parts 16 (thick portion) to which the distal ends of piezoelectric vibrators 29 (see FIG. 3) of the vibrator group 21 are secured from the rear. Elastic parts 17 are formed by retaining only the elastic film 14 (thin portion) around the island parts 16.

Similarly to the nozzle openings 10, a large number of island parts 16 are provided at pitches corresponding to the dot formation density, and each of the island parts 16 is formed as a block that is narrow in the nozzle array direction and that is long in the direction in which the piezoelectric members of the vibrators 29 are laminated, i.e., in the longitudinal direction of the pressure chambers 12.

To fabricate the flow passage unit 3, the flow passage formation plate 7 is sandwiched between the nozzle plate 8, mounted on the front side of the flow passage formation plate 7, and the elastic plate 9, mounted on the rear side, and the three components are bonded together. In the flow passage unit 3, the elastic plate 9 serves as part of a sealing member covering the ceilings of the pressure chambers 12 and the reservoirs 11.

Figure 2:
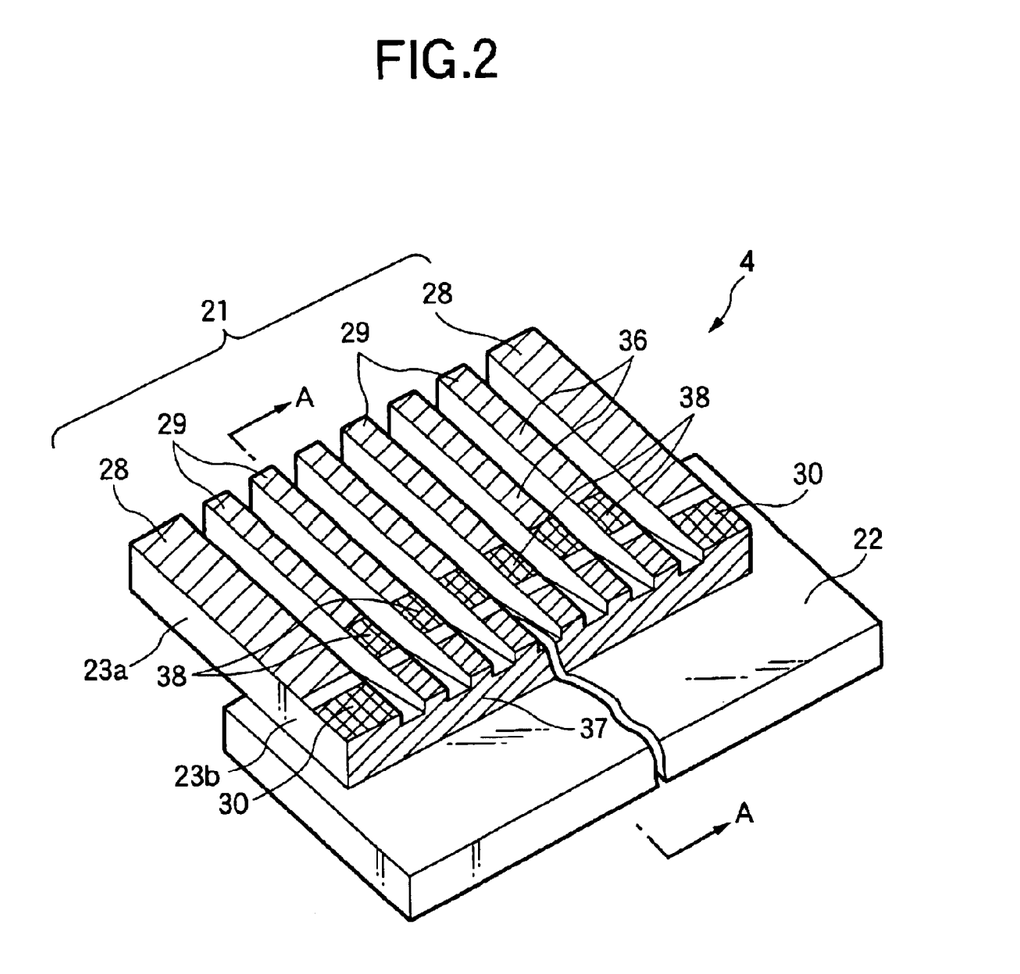
FIG. 2 is a perspective view of the external appearance of a piezoelectric vibrator unit according to one embodiment of the invention.

The piezoelectric vibrator unit 4 is mainly formed of the vibrator group 21 and a fixing plate 22 (one type of fixing member for this invention). As shown in FIG. 2, the vibrator group 21 is cut into comb-like vibrators, and includes dummy vibrators 28, which are located at ends in the array direction of the vibrators, and a large number of drive vibrators 29, which are arranged between the dummy vibrators 28. Each of the drive vibrators 29 is a piezoelectric vibrator of a lateral effect type (d31 effect), which is associated with ejection of ink droplets. The drive vibrators 29 are divided, like needles, each of which has an extremely small width of 50 to 100 μm, for example. On the other hand, the dummy vibrators 28 are piezoelectric vibrators not associated with ink droplet ejection.

Although the fixing plate 22 in this embodiment is a stainless steel plate about 2 mm thick, the present invention should not be restricted thereto. For example, the fixing plate 22 may be a resin plate, or a metal or resin block-like member.

Figure 3:
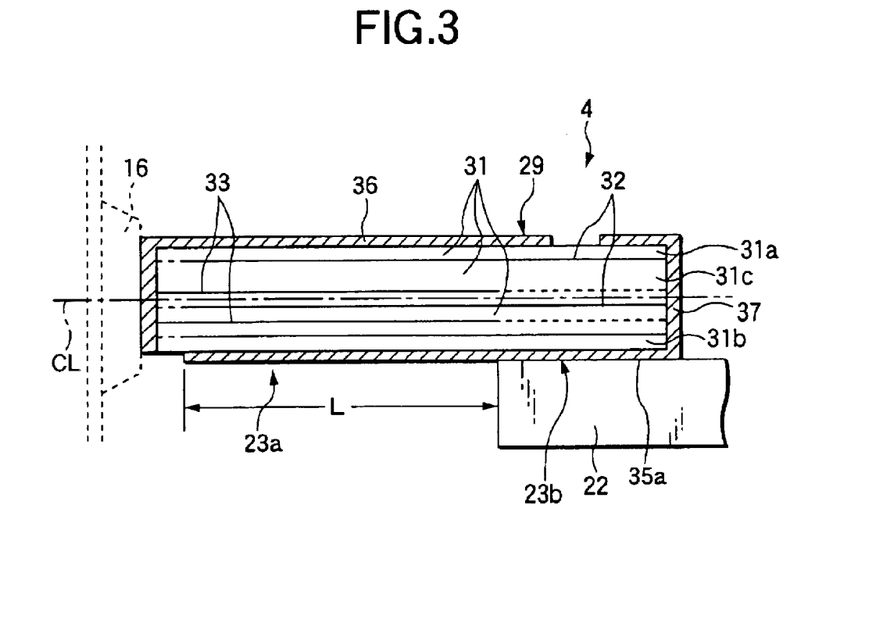
FIG. 3 is a cross-sectional view taken along line A—A in FIG. 2.

Next, the drive vibrators 29 will be described. As is shown in FIG. 3, the drive vibrators 29 are so designed that common internal electrodes 32 and segment internal electrodes 33 are alternately arranged and laminated with piezoelectric members 31 sandwiched between them. The common internal electrodes 32 are electrodes that set the same potential level for all the drive vibrators 29, and the segment internal electrodes 33 are electrodes that set a potential level for each of the drive vibrators 29. The portion of a drive vibrator 29 extending, from the leading end thereof, a distance that is equivalent to about one half or two thirds the length of the vibrator in the longitudinal direction (orthogonal to the lamination direction) is defined as a free end part 23*a*, and the portion extending from the end of the free end part 23*a* to the vibrator base end is defined as a base end part 23*b*.

An active region (an overlap portion) L, wherein the common internal electrodes 32 and the segment internal electrodes 33 overlap each other, is formed in the free end part 23*a*. And when an electric field between the internal electrodes 32 and 33 is generated by application of a potential difference to these internal electrodes 32 and 33, the piezoelectric member 31 in the active region L is deformed (activated) by the generated electric field, and the free end part 23*a* is expanded and contracted, i.e. displaced in the longitudinal direction of the vibrator.

The base ends of the common internal electrodes 32 are rendered conductive to a common external electrode 37 at the base end surface portion of the drive vibrator 29, and the leading ends of the segment internal electrodes 33 are rendered conductive to a segment external electrode 36 at the leading end surface portion of the drive vibrator 29. The leading ends of the common internal electrodes 32 are positioned slightly to the rear of the leading end surface portion of the drive vibrator 29, and the base ends of the segment internal electrodes 33 are positioned at the boundary between the free end part 23*a* and the base end part 23*b*.

The segment external electrode 36 is an electrode that is formed on and covers the leading end surface portion of the drive vibrator 29 and a wiring connection surface (the upper surface in FIG. 3, opposite the fixing plate bonded face) of the drive vibrator 29, i.e., one side surface of the drive vibrator 29 in the lamination direction. The segment external electrode 36 is used to provide a connection between the segment internal electrodes 33 and the wiring pattern of a flexible cable 24, one type of wiring member. The portion of the segment external electrode 36 on the wiring connection surface side is continuously formed from the location of the base end part 23*b* of the vibrator to the leading end of the free end part 23*a*. The common external electrode 37 is an electrode that is formed on and covers the base end surface portion of the drive vibrator 29, the wiring connection surface thereof, and the fixing plate bonded face (the lower face in FIG. 3), which is the other side face of the drive vibrator 29 in the lamination direction. The common external electrode 37 is used to provide an electrical connection between the wiring pattern of the flexible cable 24 and the common internal electrodes 32. The portion of the common external electrode 37 on the wiring connection surface side is continuously formed from a location slightly to the rear of the end of the segment external electrode 36 to the base end surface portion side, and the portion of the common external electrode 37 on the fixing plate 22 side is continuously formed from a location slightly to the rear of the leading end surface portion of the vibrator 29, to the base end surface portion side.

These external electrodes 36 and 37 also function as electrodes for activating the outermost piezoelectric members 31.

Specifically, a piezoelectric member 31*a*, which constitutes the outermost layer and is located farthest from the fixing plate 22, is sandwiched between the segment external electrode 36 and the common internal electrode 32, which overlap in the active area L. Therefore, the portion of the piezoelectric member 31*a* that corresponds to the portion where the common internal electrode 32 and the segment external electrode 36 overlap is deformed when a potential difference is generated between the electrodes 32 and 36.

Similarly, a piezoelectric member 31*b*, which constitutes the outermost layer nearest the fixing plate 22, is sandwiched between the common external electrode 37 and the segment internal electrode 33, which overlap in the active area L. Therefore, the portion of the piezoelectric member 31*b* that corresponds to the portion where the segment internal electrode 33 and the common external electrode 37 overlap is deformed when a potential difference is generated between the electrodes 33 and 37.

The base end part 23*b* functions as a non-active portion that is not expanded or contracted, even when the piezoelectric members 31 in the active region L are activated. The flexible cable 24 is arranged along the base end part 23*b* on the wiring connection side, and the segment external electrode 36, the common external electrode 37 and the flexible cable 24 are electrically connected at the base end part 23*b*. That is, the connection end of the flexible cable 24 is placed on and mounted, by soldering or the like, to common external electrode wiring portions 30 and to segment external electrode wiring portions 38 shown in FIG. 2, and drive pulses are supplied to the electrodes 32, 33, 36 and 37 by the flexible cable 24. Further, the fixing plate 22 is joined to the fixing plate attachment face of the base end part 23b. In short, the drive vibrator 29 is secured to the fixing plate 22 in a so-called cantilever manner.

The thus arranged piezoelectric vibrator unit 4 is mounted in the case 2, while, as is shown in FIG. 1, the leading ends of the free end parts 23a of the drive vibrators 29 are brought into contact with the island parts 16 from the rear, the fixing plate 22 is fixedly secured to the wall of the storage space 5, and an adhesive is used to bond the leading ends of the free end parts 23a to the island parts 16.

When a voltage is applied through a segment external electrode 36, an electric field is generated in piezoelectric members 31 in an active region L. In response to the generation of the electric field, an associated drive vibrator 29 is expanded or contracted in the longitudinal direction of the vibrator, displacing an elastic portion 17 to the front or the rear. And, as the elastic portion 17 is displaced to the front or the rear, a pressure chamber 12 is expanded or contracted and its volume is changed.

To eject an ink droplet through a nozzle openings 10, a voltage is selectively applied to a drive vibrator 29 associated with the ejection of the ink droplet, so that, for example, the associated drive vibrator 29 is contracted and then expanded in the longitudinal direction of the vibrator. As the drive vibrator 29 is contracted, an associated pressure chamber 12 is expanded, producing negative internal pressure, so that ink in the reservoir 11 flows into the pressure chamber 12. Then, as the drive vibrator 29 is expanded, the pressure chamber 12 is contracted to increase the ink pressure. As a result, the ink is forced out through the nozzle opening 10 to be ejected as the ink droplet.

Figure 4:
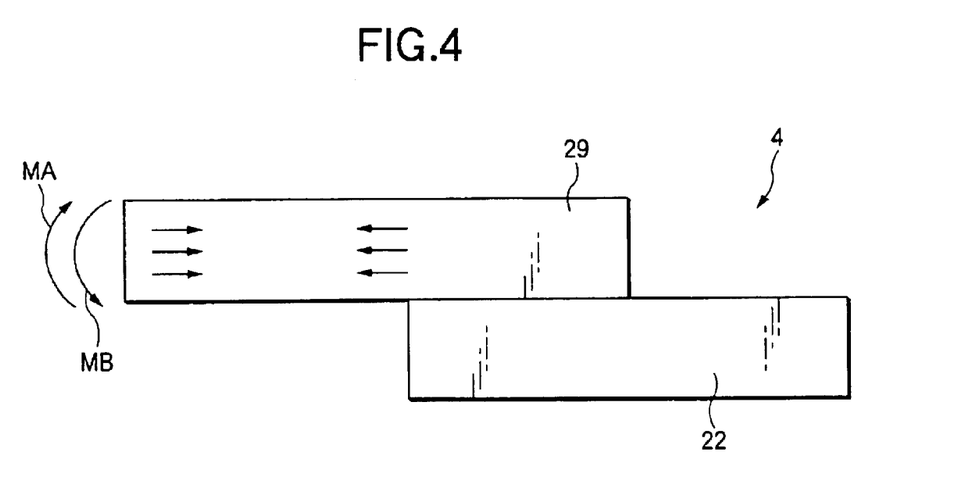
FIG. 4 is a specific diagram for explaining a bending moment that acts on a drive vibrator.

Since a drive vibrator 29 is joined to the fixing plate 22 in a cantilever manner, when the free end part 23a is contracted, the contraction of the piezoelectric member 31 in the wiring connection side is slightly more than the contraction of the piezoelectric member 31 in the fixing plate joined side. Consequently, as indicated by character MA in FIG. 4, a bending moment MA occurs in the drive vibrator 29 that tends to warp the drive vibrator 29 toward the wiring connection side. Thus, in this embodiment, to cancel out the bending moment MA, at least one piezoelectric member 31 located away from the fixing plate 22 with respect to the center line CL of the drive vibrator 29 in the lamination direction (in FIG. 3, above the center line CL), is formed to be thicker than the other piezoelectric members 31.

In the example in FIG. 3, a piezoelectric member 31c adjacent to the outermost piezoelectric member 31a, i.e., the second piezoelectric member 31c from the wiring connection side, is formed to be thicker than the other piezoelectric members 31. That is, each of the other piezoelectric members 31 has a thickness of 20 μm, whereas the piezoelectric member 31c increased in thickness has a thickness of 50 μm, which is considerably greater in comparison to the other piezoelectric members 31.

The thickness of each piezoelectric member 31, 31c is merely an appropriate example, and can be selected to generate a bending moment MB that will cancel out the bending moment MA.

Since the piezoelectric member 31c is thicker than the other piezoelectric members 31, when a voltage is applied to the internal electrodes 32 and 33, the magnitude of the electric field generated at the piezoelectric member 31c having the greater thickness is relatively smaller than the magnitude of the electric field generated at each of the other piezoelectric members 31, so that compared with the other piezoelectric members 31, the piezoelectric member 31c will be contracted smaller degree.

Since the piezoelectric member 31c is located on the side away from the fixing plate 22 with respect to the center line CL, the smaller degree of contraction of the piezoelectric member 31 causes a bending moment, as indicated by character MB in FIG. 3, when the drive vibrator 29, which acts on the drive vibrator 29 to warp the drive vibrator 29 toward the fixing plate 22. Since the bending moment MB is the reverse of the bending moment MA stemming from the joining of the drive vibrator 29 to the fixing plate 22, the bending moment MB cancels out the bending moment MA.

Therefore, the bending that would occur when the drive vibrator 29 is contracted can be suppressed, and a longitudinal displacement mode (vertical vibration mode) of the drive vibrator 29 that contributes to ink droplet ejection can be positively obtained. Thus, the drive vibrator 29, when contracted, can rearwardly retract the island portion 26 with a force uniform from longitudinal one end of the island portion 16 to the other end thereof. Similarly, when the drive vibrator 29 is expanded, the drive vibrator 29 can forwardly push the island portion 26 with a force uniform from the longitudinal one end of the island portion 16 to the other end thereof.

As a result, the excitation of a pressure wave, which reciprocates between the nozzle opening 10 and the ink supply port 13 within the pressure chamber 12, can be suppressed, and a more stable ink droplet ejection can be obtained. That is, even when the time interval between the ejection of one ink droplet and the ejection of the next is reduced, the generation of a mist or a satellite or a curved flying path of the ink droplet can be prevented.

In this embodiment, a drive vibrator 29 (corresponding to a piezoelectric vibrator of the invention) is designed such that the second piezoelectric member 31c counted from the wiring connection side is thicker than the other piezoelectric members 31. However, the invention is not limited to this arrangement. That is, the similar effects can be obtained whenever at least one of the piezoelectric members 31, located away from the fixing plate 22 with respect to the center line CL in the lamination direction, is formed to be thicker.

For example, all of the piezoelectric members 31, located away from the fixing plate 22 with respect to the center line CL (above the center line CL in FIG. 3) may be formed thicker than the piezoelectric members 31 located in the fixing plate 22 side with respect to the center line CL (below the center line CL in FIG. 3). In other words, the piezoelectric members 31 in the fixing plate 22 side with respect to the center line CL may be thinner than the piezoelectric members 31 in the wiring connection surface side with respect to the center line CL.

Figure 5:
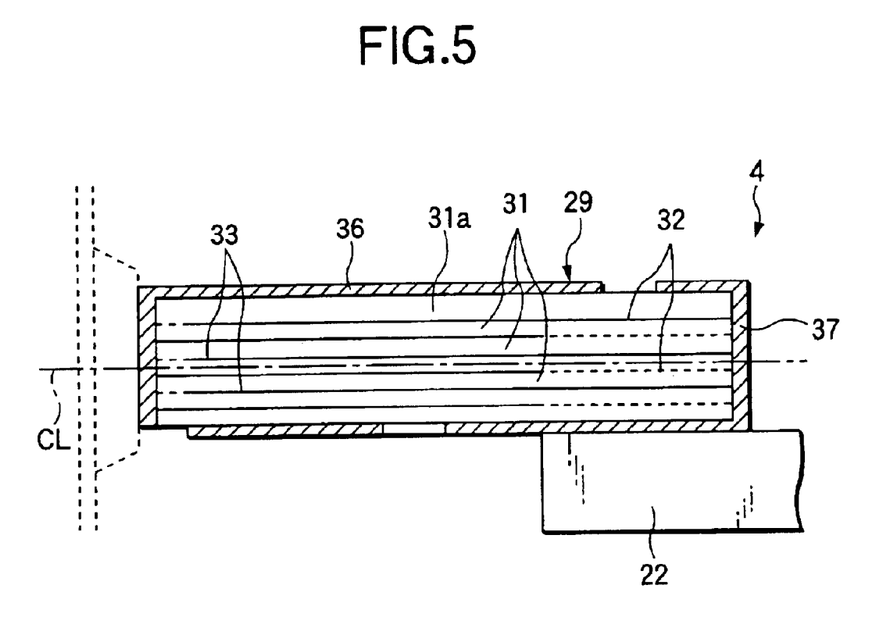
FIG. 5 is a cross-sectional view of the feature of a piezoelectric vibrator unit according to another embodiment of the invention.

Furthermore, as is shown in FIG. 5 for another embodiment, the outermost piezoelectric member 31a, which is farthest from the fixing plate 22, may be formed thicker than the other piezoelectric members 31.

With this arrangement, the piezoelectric member 31a located farthest from the fixing plate 22 functions as the portion for generating the bending moment MB, and the bending moment MA resulting from the joining to the fixing plate 22 can be efficiently canceled.

Moreover, the thicknesses of the piezoelectric members 31 of a drive vibrator 29 may be gradually increased from the fixing plate joining surface to the wiring connection surface. That is, as a distance from a piezoelectric member 31 to the fixing plate 22, to which the drive vibrator is joined, is larger, the thickness of the piezoelectric member 31 in the lamination direction is larger.

With this configuration, when a voltage is applied to the internal electrodes 32 and 33 via the external electrodes 36 and 37, a relatively larger electric field is applied to the piezoelectric member 31 located closer to the fixing plate 22, whereas a progressively smaller electric field is applied to the piezoelectric member 31 located farther from the fixing plate 22 in the lamination direction. Therefore, the piezoelectric member 31 closest to the fixing plate 22 is most easily contracted, and the contraction of the piezoelectric members 31 is reduced gradually as the distance from the piezoelectric members 31 to the fixing plate 22 increases. In other words, a characteristic according to which the fixing plate joined side is likely to be contracted and the wiring connection side is less likely to be contracted can be provided.

As a result, with this structure also, when a drive vibrator 29 is contracted, the bending moment MB acts to cancel the bending moment MA resulting from the joining of the drive vibrator 29 to the fixing plate 22. Therefore, the longitudinal displacement of the drive vibrator 29 can be positively obtained.

In these embodiments, since a specific piezoelectric member 31 is formed that is thicker than the others, the magnitude of the electric field applied to this specific piezoelectric member 31 is reduced relative to the magnitude of the electric field applied to each of the others. However, another arrangement may be employed so long as the magnitude of the electric field to be applied to a specific piezoelectric member 31 can be reduced.

In short, various arrangements can be applied so long as the electric field applied to at least one piezoelectric field 31 located away from the fixing plate 22 with respect to the center line CL in the lamination direction is reduced relative to the electric fields applied to the other piezoelectric members 31, or the electric fields applied to the piezoelectric members 31 are gradually reduced from the joining surface of the drive vibrator 29 joined to the fixing plate 22 in the lamination direction of the piezoelectric members 31.

In addition, the invention can be applied to a piezoelectric vibrator unit in which the common external electrode 37 is not formed on the fixing plate joining surface side in the free end part 23a, i.e., a piezoelectric vibrator unit in which an external electrode is not formed on the side face of the free end part 23a nearest the fixing plate 22 and the face of a piezoelectric member 31b is exposed.

In this case, since the piezoelectric member 31b nearest the fixing plate 22 is not deformed because no electric field is applied thereto, the bending moment MA is increased. However, merely by forming a piezoelectric member 31 that is considerably thicker than the other piezoelectric members 31 and that is far from the fixing plate 22 with respect to the center line CL, a bending moment MB that acts on the drive vibrator 29 can be produced that cancels out the bending moment MA.

Therefore, with this arrangement, the longitudinal displacement of the drive vibrator 29 can also be positively obtained. Further, with this structure, since the side face of the free end part 23a nearest the fixing plate 22 is defined as a piezoelectric member face, the external electrodes 36 and 37 need only be formed on the vibrator leading end part, the vibrator base end part and the wiring connection part. Thus, the external electrodes can be easily formed, manufacturing efficiency can be increased, and the recording head 1 can be fabricated at a low cost.

In these embodiments, the piezoelectric member(s) 31 located far from the fixing plate 22 is thicker than the piezoelectric member 31 nearer the fixing plate 22 in order to cancel out the bending moment MA resulting from the joining to the fixing plate 22. However, the invention is not limited to this arrangement, and can be variously modified.

For example, the external electrodes 36 and 37, which are located opposite the fixing plate 22 in the direction in which the piezoelectric members 31 are laminated, may be formed considerably thicker than the internal electrodes 32 and 33, and may be used to cancel out the bending moment MA resulting from the joining to the fixing plate 22. An explanation will now be given for an additional embodiment that employs the thus described structure.

Figure 6:
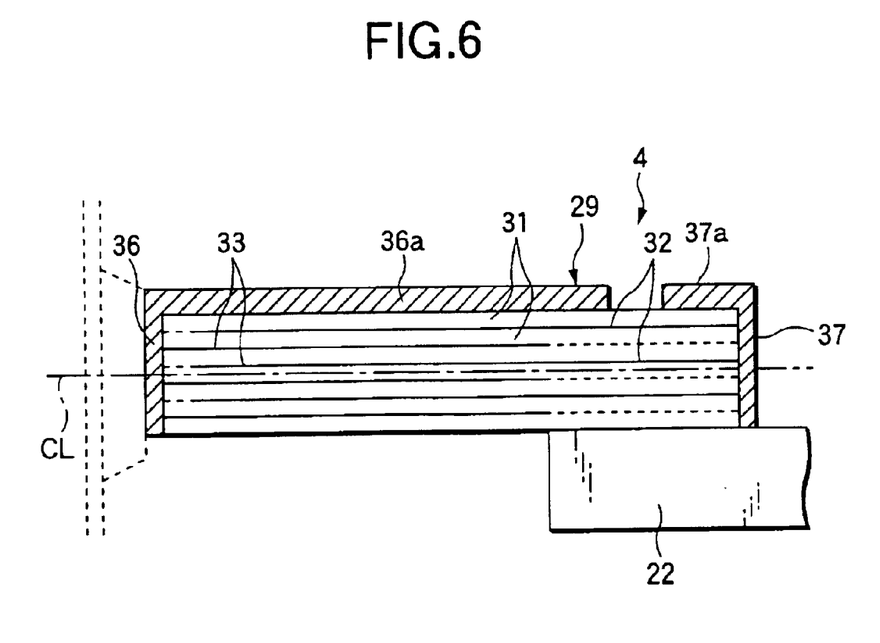
FIG. 6 is a cross-sectional view of the feature of a piezoelectric vibrator unit according to an additional embodiment of the invention.

In the embodiment shown in FIG. 6, a side part 36a, i.e. a part of the segment external electrode 36 formed on the wiring connection surface (a surface opposite from the fixing plate joining surface), and a side part 37a, i.e. a part of the common external electrode 37 formed on the wiring connection surface, are thicker than the internal electrodes 32 and 33. As a specific example, in case where the thickness of each of the internal electrodes 32 and 33 is 2 µm, the thickness of each of the side parts 36a and 37a is about 10 to 20 µm.

Since the external electrodes 36 and 37, specifically, the side parts 36a and 37a, are sufficiently thicker than the internal electrodes 32 and 33, the external electrodes 36 and 37 can function as contraction brakes because they are not related to the contraction of the drive vibrator 29. Therefore, when the drive vibrator 29 is contracted, the bending moment MB, for warping the drive vibrator 29 toward the fixing plate 22, can act on the drive vibrator 29 and cancel out the bending moment MA. Therefore, with this arrangement also, the bending of the drive vibrator 29 can be suppressed.

The values given for the thicknesses are merely examples, and the thicknesses of the side parts 36a and 37a are so set that a bending moment MB can be obtained that can cancel out the bending moment MA.

As is described above, the embodiment in FIG. 6 is designed such that the external electrodes 36 and 37 are used as brakes against the contraction of the drive vibrator 9 to thereby generate, a bending moment MB canceling the bending moment MA. It is apparent, from the fact that the external electrodes 36 and 37 function as brakes, the longitudinal lengths or thicknesses of the external electrodes 36 and 37 can be varied to adjust the magnitude of the bending moment MB.

For example, in an arrangement as in the embodiment shown FIG. 3, in which the entire side surface of the free end part 23a in the wiring connection surface side is covered with the segment external electrode 36, and a part of the side surface of the free end part 23a in the fixing plate 22 side is covered with the common external electrode 37, it is possible to adjust the magnitude of the bending moment MB by varying the length of the common external electrode 37 formed in the free end part 23a side. With this arrangement, a fine adjustment can be applied to the magnitude of the bending moment MB, to thereby more reliably suppress the bending of the drive vibrator 29.

The internal eletrodes 32 and 33, as well as the external electrodes 36 and 37, are not concerned with the contraction of the drive vibrator 29. Therefore, the similar effects as described above can be obtained by forming specific internal electodes 32 and 33 to be thicker than the other internal electrodes 32 and 33.

For example, at least one internal electrode 32, 33 located away from the fixing plate 22 with respect to the center line CL in the lamination direction is formed thicker than the other internal electrodes 32, 33, or the thicknesses of the internal electrodes 32, 33 are gradually increased such that, as a distance between an internal electrode 32, 33 and the joining surface to the fixing plate 22 in the vibrator member lamination direction is larger, the thickness of the internal electrode 32, 33 is larger. These arrangements also produce the bending moment MB acting on the drive vibrator 29 to cancel the bending moment MA.

Since the internal electrodes 32 and 33 are used to apply an electric field to a corresponding piezoelectric member 31, the length of a portion of the corresponding piezoelectric member 31 to which an electric field is applied varies, depending on the lengths of the internal electrodes 32 and 33 in the longitudinal direction of the vibrator. In view of this, at least one pair of internal electrodes 32 and 33 located away from the fixing plate 22 with respect to the center line CL in the lamination direction can be shorter than the other pairs of internal electrodes 32 and 33 to produce the bending moment MB acting on the drive vibrator 29. This is because the piezoelectric member(s) 31 corresponding to the short pair of internal electrodes 32, 33 has an electric field applied portion shorter than electric filed applied portions of the other piezoelectric members 31, and thus the corresponding piezoelectric member(s) 31 is less likely to be contracted accordingly. Therefore, with this arrangement, the bending moment MA can also be canceled out.

By using a bending moment adjustment member, the similar effects obtained in the embodiments can also be obtained. In a further embodiment shown in FIG. 7, a bending moment adjustment member 40 is attached to the wiring connection surface (i.e., the vibrator side face), opposite the fixing plate 22 joining surface in the lamination direction of the piezoelectric members 31.

Figure 7:
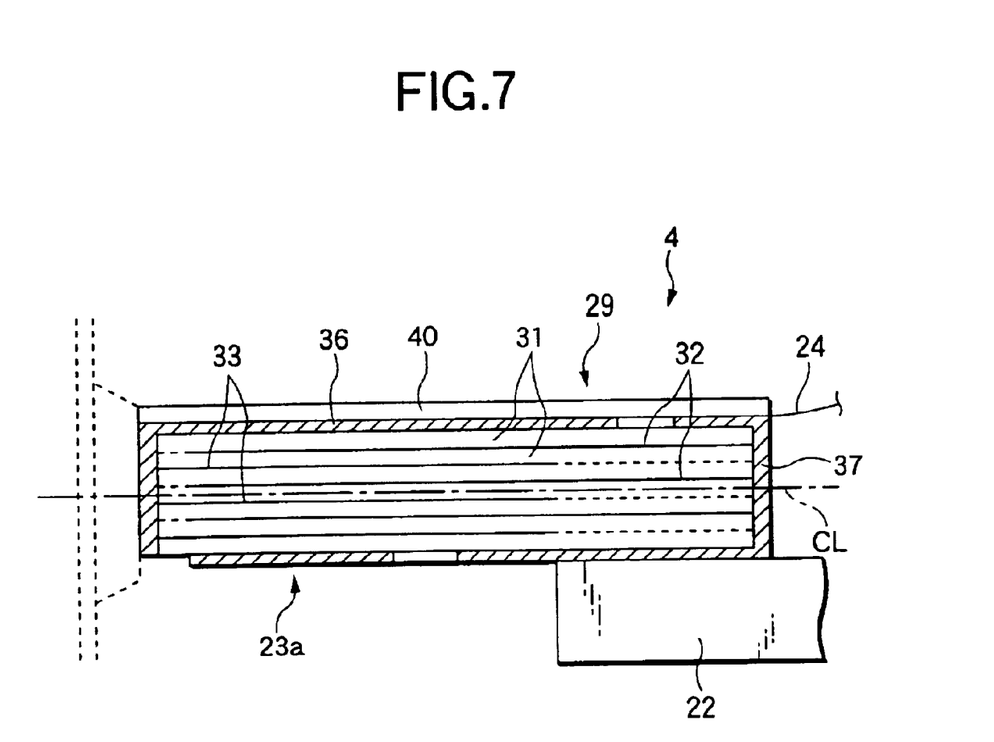
FIG. 7 is a cross-sectional view of the feature of a piezoelectric vibrator unit according a further embodiment of the invention.

The bending moment adjustment member 40 is not concerned with the contraction of the drive vibrator 29, and is formed of a thin, elastic material. An elastic metal plate, more specifically, a stainless steel plate, the surface of which is electrically insulated, can be adapted for use as the bending moment adjustment member 40. The bending moment adjustment member 40 is integrally adhered to the external electrodes 36 and 37 on the wiring connection surface side. The bending moment adjustment member 40 may be adhered to the entire wiring connection surface or to the side face only in the free end part 23a.

When the bending moment adjustment member 40 is adhered to the entire wiring connection surface, the flexible cable 24 is sandwiched between the bending moment adjustment member 40 and the external electrodes 36 and 37.

When the bending moment adjustment member 40 is adhered on a vibrator side face opposite the fixing plate 22 side, the bending moment adjustment member 40 can serve as a brake against the contraction of the drive vibrator 29 because it is not concerned with the contraction. Therefore, the bending moment MB for warping the drive vibrator 29 toward the fixing plate 22 during the contraction can act on the drive vibrator 29 and cancel out the bending moment MA. As a result, this arrangement can also suppress the bending of the drive vibrator 29.

As is described above, the invention can provide the following effects.

Since non-uniform electric fields are applied to piezoelectric member layers, a piezoelectric member to which a low electric field is applied is less likely to be contracted, compared with other piezoelectric members. Consequently, a bending moment is produced, which acts on a drive vibrator to warp the vibrator toward a fixing plate during the contraction, and cancels a bending moment stemming from the joining of the piezoelectric vibrator to the fixing plate.

As a result, it is possible to suppress the bending of the piezoelectric vibrator to prevent the excitation of a pressure wave due to the bending, thereby stabilizing ink droplet ejection.

When piezoelectric members are formed with non-uniform thicknesses, an electric field applied to a thick piezoelectric member is reduced relative to an electric field that is applied to other piezoelectric members, and the thick piezoelectric member is less likely to be contracted in comparison with the other piezoelectric members.

With this thick piezoelectric member, a bending moment is produced, which acts on a drive vibrator to warp the vibrator toward a fixing plate during the contraction, and cancels a bending moment stemming from the joining of the piezoelectric vibrator to the fixing plate.

As a result, it is possible to suppress the bending of the piezoelectric vibrator to prevent the excitation of a pressure wave due to the bending, thereby stabilizing ink droplet ejection.

In the arrangement wherein a voltage is applied so that the magnitude of the electric field produced for piezoelectric members is gradually reduced as the distance from the fixing members in the lamination direction increases, a characteristic is obtained according to which a piezoelectric vibrator nearer the fixing member is contracted more, and a piezoelectric member that is far from the fixing member is contracted less.

With this characteristic, a bending moment is produced, which acts on a drive vibrator during the contraction to warp the vibrator toward a fixing plate and cancels a bending moment stemming from the joining of the piezoelectric vibrator to the fixing plate.

As a result, it is possible to suppress the bending of the piezoelectric vibrator to prevent the excitation of a pressure wave due to the bending, thereby stabilizing ink droplet ejection.

In the arrangement wherein the thicknesses of piezoelectric members are increased as the distances of the piezoelectric members from the fixing member joining face in the lamination direction increases, upon the application of a voltage to the internal electrodes, a relatively strong electric field is applied to a piezoelectric member nearer the fixing member, and the strength of electric field applied to a piezoelectric member are reduced as the distance of the piezoelectric member from the fixing member in the lamination direction progressively increases. Therefore, a characteristic is obtained according to which the piezoelectric member in the fixing member side is contracted more and the piezoelectric member farther from the fixing member is contracted less.

With this characteristic, a bending moment is produced, which acts on a drive vibrator during the contraction to warp the vibrator toward a fixing plate and cancels a bending moment stemming from the joining of the piezoelectric vibrator to the fixing plate.

As a result, it is possible to suppress the bending of the piezoelectric vibrator to prevent the excitation of a pressure wave due to the bending, thereby stabilizing a more stable ink droplet ejection can be obtained.

Further, in the arrangement where the outermost piezoelectric member located farthest from the fixing member is formed thicker than the other piezoelectric members, the bending moment caused due to the joining to the fixing member can be efficiently canceled.

In the arrangement where the external electrodes opposite from the fixing member in the piezoelectric member lamination direction are formed thicker than the internal electrodes, the external electrodes serve as the brakes against the contraction of the piezoelectric vibrator. Consequently, a bending moment is produced, which acts on the drive vibrator during the contraction to warp the vibrator toward a fixing plate and cancels a bending moment stemming from the joining of the piezoelectric vibrator to the fixing plate.

As a result, it is possible to suppress the bending of the piezoelectric vibrator to prevent the excitation of a pressure wave due to the bending, thereby stabilizing ink droplet ejection.

In the arrangement wherein internal electrodes with non-uniform thicknesses are formed, a thick internal electrode serves as a brake against the contraction of the piezoelectric vibrator. Consequently, a bending moment is produced, which acts on the drive vibrator during the contraction to warp the vibrator toward a fixing plate and cancels out a bending moment stemming from the joining of the piezoelectric vibrator to the fixing plate.

As a result, it is possible to suppress the bending of the piezoelectric vibrator to prevent the excitation of a pressure wave due to the bending, thereby stabilizing ink droplet ejection.

In the arrangement wherein the thicknesses of internal electrodes increase as the distance thereof in the lamination direction from the fixing member increases, a characteristic can be provided according to which the piezoelectric vibrator farther from the fixing member is contracted less because of the differences in the thicknesses of the internal electrodes. Therefore, a bending moment is produced, which acts on a drive vibrator during the contraction to warp the vibrator toward a fixing plate and cancels a bending moment stemming from the joining of the piezoelectric vibrator to the fixing plate.

As a result, it is possible to suppress the bending of the piezoelectric vibrator to prevent the excitation of a pressure wave due to the bending, thereby stabilizing ink droplet ejection.

In the arrangement wherein a bending moment adjustment member is attached to a vibrator side face opposite a fixing member joining face in the lamination direction, the bending moment adjustment member is not concerned with the contraction of the piezoelectric vibrator, and can serve as a brake against the contraction. Therefore, a bending moment is produced, which acts on a drive vibrator during the contraction to warp the vibrator toward a fixing plate and cancels a bending moment stemming from the joining of the piezoelectric vibrator to the fixing plate.

As a result, it is possible to suppress the bending of the piezoelectric vibrator to prevent the excitation of a pressure wave due to the bending, thereby stabilizing ink droplet ejection.

What is claimed is:

1. A piezoelectric vibrator unit comprising:
   at least one piezoelectric vibrator including:
     common internal electrode layers and segment internal electrode layers arranged alternately;
     piezoelectric layers, each interposed between adjacent pair of the common and segment internal electrode layers; and
     external electrodes formed on an exterior of the piezoelectric vibrator and electrically connected respectively to the common internal electrode layers and the segment internal electrode layers; and
   a fixing member to which a surface of the piezoelectric vibrator is fixed;
   wherein the piezoelectric vibrator is displaceable in a direction perpendicular to a lamination direction in which the internal electrode layers and piezoelectric layers are laminated;
   wherein a magnitude of electric fields applied between the common and segment internal electrode layers to the piezoelectric layers is non-uniform to cancel a bending moment caused during contraction of the piezoelectric vibrator.

2. The piezoelectric vibrator unit according to claim 1, where the electric fields applied to the piezoelectric layers have respective, different magnitude.

3. The piezoelectric vibrator unit according to claim 1, wherein magnitude of an electric field applied to a piezoelectric layer located farther from a thickness center of the piezoelectric vibrator in the lamination direction is smaller than magnitude of an electric field applied to a piezoelectric layer located closer to the thickness center in the lamination direction.

4. The piezoelectric vibrator unit according to claim 1, wherein as a piezoelectric layer is located farther from the surface fixed to the fixing member in the lamination direction, magnitude of electric field applied to the piezoelectric layer is smaller.

5. A piezoelectric vibrator unit comprising:
   at least one piezoelectric vibrator including:
     common internal electrode layers and segment internal electrode layers arranged alternately;
     piezoelectric layers, each interposed between adjacent pair of the common and segment internal electrode layers; and
     external electrodes formed on an exterior of the piezoelectric vibrator and electrically connected respectively to the common internal electrode layers and the segment internal electrode layers; and
   a fixing member to which a surface of the piezoelectric vibrator is fixed;
   wherein the piezoelectric vibrator is displaceable in a direction perpendicular to a lamination direction in which the internal electrode layers and piezoelectric layers are laminated;
   wherein the piezoelectric layers are non-uniform in thickness.

6. The piezoelectric vibrator unit according to claim 5, wherein at least one of the piezoelectric layers, located away from the surface fixed to said fixing member, is thicker than other piezoelectric layers.

7. The piezoelectric vibrator unit according to claim 5, wherein as a piezoelectric layer is located farther from the surface fixed to the fixing member the lamination direction, the piezoelectric layer is thicker.

8. The piezoelectric vibrator unit according to claim 5, wherein an outermost piezoelectric layer, located farthest from the surface fixed to the fixing member, is thicker than other piezoelectric layers.

9. A piezoelectric vibrator unit comprising:
   at least one piezoelectric vibrator including:
     common internal electrode layers and segment internal electrode layers arranged alternately;
     piezoelectric layers, each interposed between adjacent pair of the common and segment internal electrode layers; and external electrodes formed on an exterior of the piezoelectric vibrator and electrically connected respectively to the common internal electrode layers and the segment internal electrode layers; and a fixing member to which a first surface of the piezoelectric vibrator is fixed;

wherein the piezoelectric vibrator is displaceable in a direction perpendicular to a lamination direction in which the internal electrode layers and piezoelectric layers are laminated;

wherein the internal electrode layers are non-uniform in thickness.

10. The piezoelectric vibrator unit according to claim 9, wherein at least one of the internal electrode layers, located away from a center line in the lamination direction, is thicker than other internal electrodes.

11. The piezoelectric vibrator unit according to claim 9, wherein as an internal electrode layer is located farther from the surface fixed to the fixing member in the lamination direction, the internal electrode layer is thicker.

12. A piezoelectric vibrator unit comprising:
at least one piezoelectric vibrator including:
common internal electrode layers and segment internal electrode layers arranged alternately;
piezoelectric layers, each interposed between adjacent pair of the common and segment internal electrode layers; and
external electrodes formed on an exterior of the piezoelectric vibrator and electrically connected respectively to the common internal electrode layers and the segment internal electrode layers; and
a fixing member to which a first surface of the piezoelectric vibrator is fixed;
wherein the piezoelectric vibrator is displaceable in a direction perpendicular to a lamination direction in which the internal electrode layers and piezoelectric layers are laminated;
wherein an electric field applied portion of at least one of the piezoelectric layers, located away from the surface fixed to the fixing member, is shorter than other electric field applied portions of other piezoelectric layers that are located between the at least one piezoelectric layer and the first surface.

13. The piezoelectric vibrator unit according to one of claims 1, 5, 9 and 12, wherein said at least one piezoelectric vibrator includes comb-like piezoelectric vibrators constructing a piezoelectric vibrator group.

14. The piezoelectric vibrator unit according to one of claims 1, 5, 9, and 12, wherein the piezoelectric vibrator further includes a non-active portion that is not expanded or contracted even when the piezoelectric layers in an active region are driven, and the fixing member is joined to a side surface of the non-active portion.

15. An ink-jet recording head comprising:
a piezoelectric vibrator unit according to one of claims 1, 5, 9, and 12, and
a flow passage unit having an elastic plate serving as a part of a seal member for sealing a pressure chamber communicated with a nozzle openings,
wherein said piezoelectric vibrator unit is attached by fixing a distal end face of the piezoelectric vibrator to the elastic plate.

16. The piezoelectric vibrator unit according to claim 12, wherein a length of a pair of the internal electrodes applying an electric field to the at least one piezoelectric layer is shorter than other pairs of the internal electrodes applying electric fields to the other piezoelectric layers.

17. An piezoelectric vibrator unit comprising at least one piezoelectric vibrator, and a fixing member to which a first side surface of the piezoelectric vibrator at a base end thereof is fixed, the piezoelectric vibrator having, at least in part, a laminated structure including common and segment internal electrode layers laminated alternately with a piezoelectric layer interposed between each adjacent pair of the common and segment internal electrode layers, a first external electrode electrically conducted to the common internal electrode layers, and a second external electrode electrically conducted to the segment internal electrode layers, so that the piezoelectric vibrator is displaceable in a direction perpendicular to a lamination direction,
wherein the piezoelectric vibrator further includes a counterbalancing bending moment producing portion that produces a bending moment canceling a bending moment caused during contraction of the piezoelectric vibrator due to a structure in which the first side surface of the piezoelectric vibrator is fixed at the base end thereof to the fixing member.

18. The piezoelectric vibrator unit according to claim 17, wherein the counterbalancing bending moment producing portion includes at least one piezoelectric layer which is located closer to a second surface, opposite from the first surface in the lamination direction, than to the first surface and which is thicker than other piezoelectric layers.

19. The piezoelectric vibrator unit according to claim 18, wherein the at least one piezoelectric layer includes an outermost piezoelectric layer forming the second surface.

20. The piezoelectric vibrator unit according to claim 18, wherein the at least one piezoelectric layer includes piezoelectric layers gradually increased in thickness in a direction from the first surface to the second surface.

21. The piezoelectric vibrator unit according to claim 17, wherein the counterbalancing bending moment producing portion includes at least one internal electrode layer which is located closer to a second surface, opposite from the first surface in the lamination direction, than to the first surface and which is thicker than other internal electrode layers.

22. The piezoelectric vibrator unit according to claim 21, wherein the at least one internal electrode layer includes internal electrode layers gradually increased in thickness in a direction from the first surface to the second surface.

23. The piezoelectric vibrator unit according to claim 17, wherein the counterbalancing bending moment producing portion includes thick parts of the external electrodes, which are formed on a second surface of the piezoelectric vibrator opposite from the first surface.

24. The piezoelectric vibrator unit according to claim 17, wherein the counterbalancing bending moment producing portion includes an bending moment adjusting member attached to a second surface of the piezoelectric vibrator opposite from the first surface.

* * * * *